(12) United States Patent
Fanning

(10) Patent No.: US 6,650,586 B1
(45) Date of Patent: Nov. 18, 2003

(54) CIRCUIT AND SYSTEM FOR DRAM REFRESH WITH SCOREBOARD METHODOLOGY

(75) Inventor: Blaise B. Fanning, Cameron Park, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/606,365

(22) Filed: Jun. 28, 2000

(51) Int. Cl.[7] .................................................. G11C 7/00

(52) U.S. Cl. ....................... 365/222; 711/106

(58) Field of Search ........................... 365/222; 711/106

(56) References Cited

U.S. PATENT DOCUMENTS

| 5,185,741 A | * | 2/1993 | Iguchi et al. ................ 370/361 |
| 5,265,231 A | * | 11/1993 | Nuwayser .................... 365/222 |
| 5,873,114 A | * | 2/1999 | Rahman et al. .............. 365/222 |
| 6,076,139 A | * | 6/2000 | Welker et al. ............... 711/104 |

* cited by examiner

Primary Examiner—Van Thu Nguyen
(74) Attorney, Agent, or Firm—Michael J. Nesheiwat

(57) ABSTRACT

A circuit comprising a first register and a second register to store the first and second status of the plurality of memory banks. Also, the circuit comprises a logic and an encoder circuit. The logic is coupled to the first and second registers and generates a third status of the plurality of memory banks based on the first and second status. The encoder coupled to the logic generates a refresh request in response to the third status of the plurality of memory banks.

26 Claims, 6 Drawing Sheets

| Row2 | 1 | 0 | B0 | B3 | 0 | 0 | 0 | 0 |
|------|---|---|----|----|---|---|---|---|
| Row1 | 1 | 0 | B1 | Rsvd | 0 | 1 | 0 | 0 |
| Row0 | 0 | 0 | B2 | Rsvd | 0 | 1 | 0 | 0 |

FIG. 3

| Row2 | 1 | 0 | B0 | B3 | 0 | 1 | 0 | 0 |
|------|---|---|----|----|---|---|---|---|
| Row1 | 1 | 0 | B1 | Rsvd | 0 | 0 | 0 | 0 |
| Row0 | 0 | 0 | B2 | Rsvd | 0 | 1 | 0 | 0 |

FIG. 4

CIRCUIT AND SYSTEM FOR DRAM REFRESH WITH SCOREBOARD METHODOLOGY

BACKGROUND OF THE INVENTION

1. Field of the Invention

The present invention relates to a dynamic random access memory, and specifically to a system and circuit for refresh of a dynamic random access memory.

2. Description of the Related Art

A DRAM, or Dynamic Random Access Memory, contains a memory cell array having a plurality of individual memory cells arranged as a matrix of rows and columns. Each memory cell is coupled to one of a plurality of bit lines and to one of a plurality of word lines. This matrix is usually subdivided into a number of banks. When a DRAM delivers data from a bank, an entire row of data from the memory cells is moved from the matrix into an array of sense amplifiers, a process known as "opening a page". Subsequently, the sense amplifiers transfer a subset of the data to the DRAM device pins. Once the data has been delivered to the pins, the page can be "closed". When the page is closed, the row of data is moved from the sense amplifiers back into the memory cells.

Each memory cell in a DRAM is constructed from a single transistor and a single capacitor and is called dynamic because its data decays and become invalid due to various leakage current paths to surrounding cells and to the substrate. Therefore, to keep the data in the cells valid, each memory cell is periodically refreshed. Data in the DRAM cell array is refreshed every time it is read out of the cell array into the sense amplifiers and subsequently rewritten into the cells.

The agent that reads data out of DRAM and writes data into DRAM is known as a memory controller or DRAM controller. This memory controller is responsible for opening and closing pages, reading and writing data, and for periodically performing refresh maintenance operations on the memory cell array. Every row of the memory array needs to be refreshed before the data in the row decays to an invalid state. The typical refresh time period for one row of the DRAM array is a few microseconds. In addition, memory controllers are often designed so that they leave pages in the open state for prolonged periods of time in order to enhance memory system performance. However, since the sense amplifiers are used for the refresh operation, a fundamental conflict arises between convenient execution of refresh requests and a high-performance paging policy.

This conflict may be resolved in a multitude of ways. One current solution is closing open pages that interfere with necessary refresh operations. Another existing solution is delaying refresh operations if there is an interference with pages that are currently open. The first policy degrades memory access operations in favor of timely refresh. The second policy also addresses the conflict, but does not fully utilize the bandwidth of the DRAM interface because of the intentional delay of the refresh operations.

BRIEF DESCRIPTION OF THE SEVERAL VIEWS OF THE DRAWINGS

The present invention is illustrated by way of example and not limitation in the following figures. Like references indicate similar elements, in which:

FIG. 3 illustrates an instruction packet utilized by an embodiment of the present invention.

FIG. 4 illustrates an instruction packet utilized by an embodiment of the present invention.

DETAILED DESCRIPTION OF THE INVENTION

A circuit and a system for refreshing a dynamic random access memory are described. In the following description, for purposes of explanation, numerous details are set forth in order to provide a thorough understanding of the present invention. However, it will be apparent to one skilled in the art that these specific details are not required in order to practice the present invention.

Figure 1:
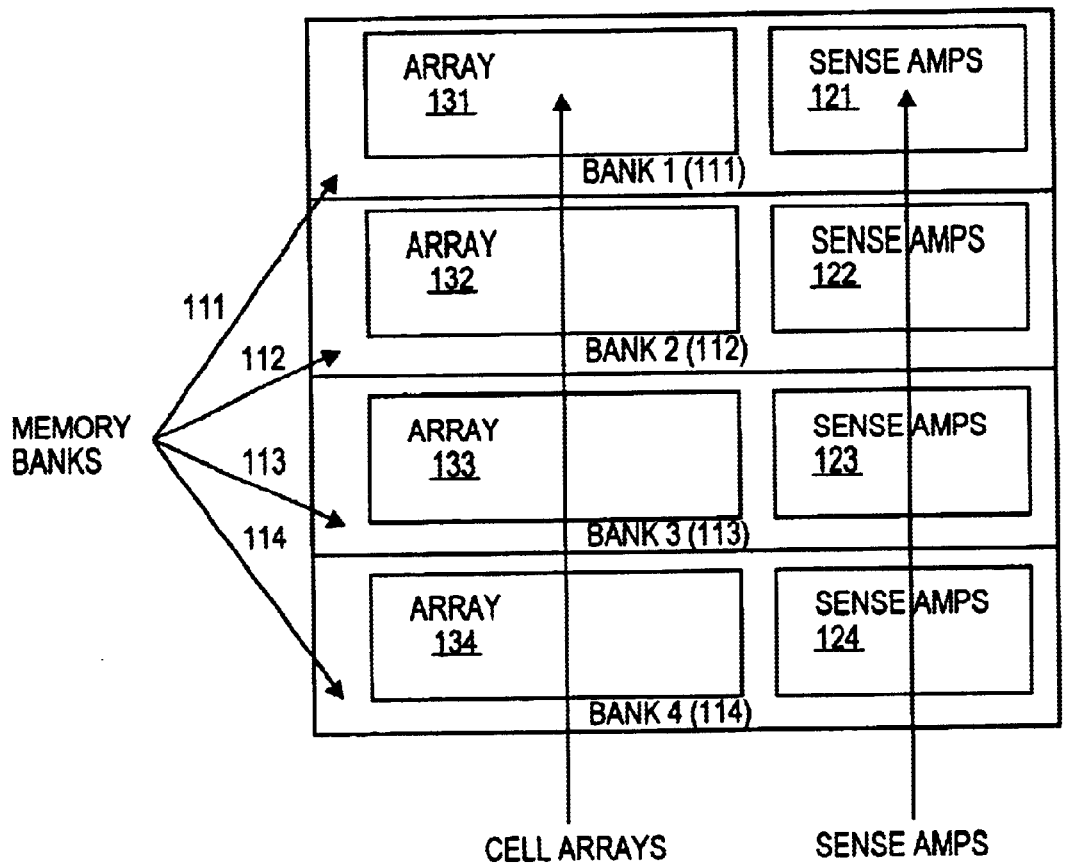
FIG. 1 illustrates a memory block diagram utilized by an embodiment of the present invention.

FIG. 1 illustrates a block diagram of a prior art memory block diagram utilized by an embodiment of the present invention. The memory block comprises a plurality of memory banks 111–114, where each bank is composed of a set of sense amplifiers 121–124 and a cell array 131–134. For example, memory bank 111 comprises a set of sense amplifiers 121 and a cell array 131. The cell array comprises a plurality of memory cells, and is organized into a plurality of memory pages or memory banks. In one embodiment, the memory cells are dynamic random access memory cells (DRAM) and there are four memory banks. Each memory bank 111–114 has a status. The memory bank may have an open status, where one row of data is loaded into the respective set of sense amplifiers. Alternatively, the bank may have a closed status, which indicates that no data is currently loaded into the respective set of sense amplifiers. A memory bank could be closed for a variety of reasons including a special processor operation for conserving power, a transitory state between access to one row in a bank and another row in the same bank, and a memory-controller determination that no activity is imminent for a particular bank.

Figure 2:
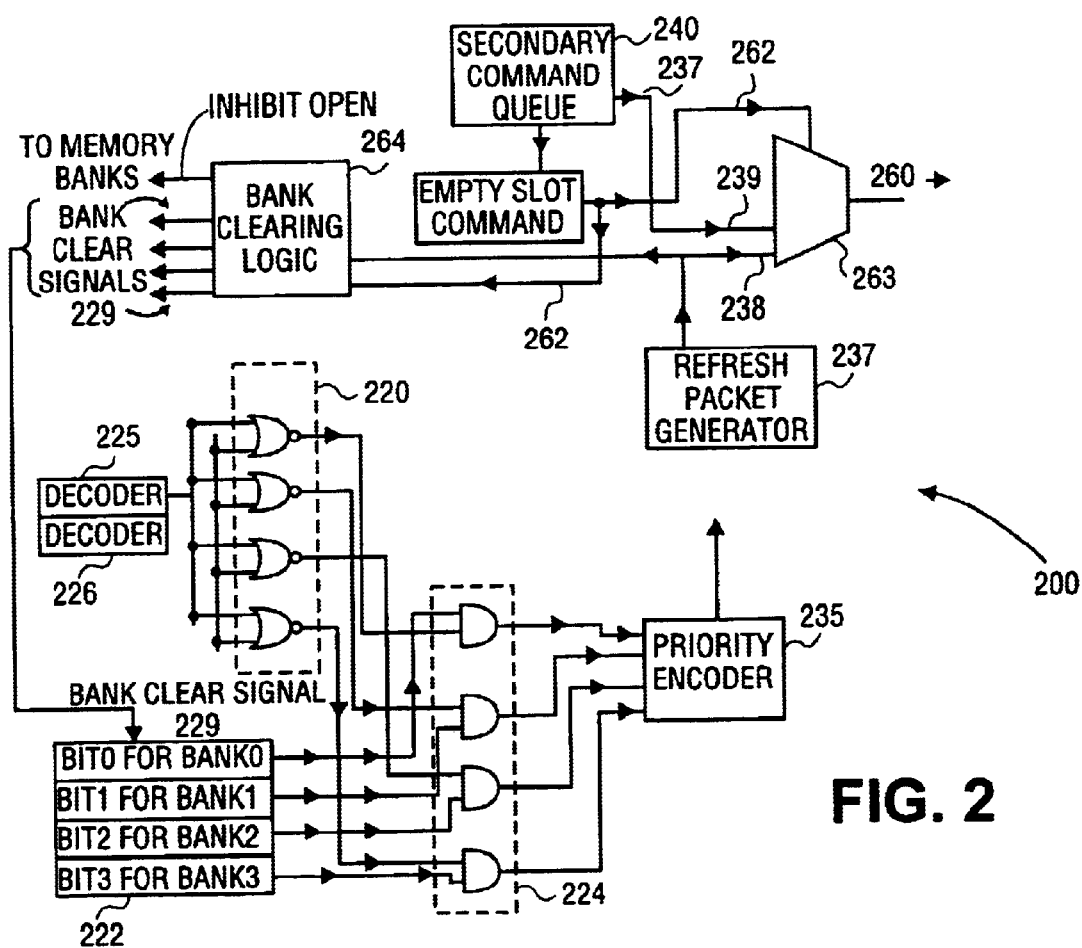
FIG. 2 illustrates a circuit utilized by an embodiment of the present invention.

FIG. 2 illustrates a circuit 200 that generates refresh requests for closed memory banks 111–114. The circuit 200 comprises a set of decoders 225 and 226 that receive an open status of the memory banks. The set of decoders is coupled to a plurality of NOR logic gates 220. A status array 222 stores a refresh status of the memory banks 111–114 and is coupled to a plurality of logic AND gates 224. Also, the plurality of NOR logic gates 220 are coupled to the plurality of logic AND gates 224. An output of the plurality of logic AND gates 224 is encoded by a priority encoder 235 to create a refresh request. The refresh request is forwarded to a refresh packet generator 237 and is converted into a refresh packet capable of being interpreted by the DRAM device. In one embodiment, the priority encoder 235 contains the refresh packet generator, and the encoder generates the refresh packet. In another embodiment, the encoder generator generates the refresh request and the refresh packet generator generates the refresh packet. A multiplexer 263 having inputs coupled to the refresh packet generator 237 and the queue 240, receives and forwards the refresh packet to a memory chip via a command bus 280 based on control input provided by empty slot detector 261. The refresh packet is also forwarded to a bank clearing logic 264 and initiates a signal to block read and write access to the memory banks 111–114 and to reset the status array 222.

The circuit 200 receives memory requests from, for example, a processor, a system, or a microcontroller. A memory request references a memory bank, and more specifically, a page within the array of the memory bank. Typical paging logic determines if the page and the corresponding bank, referenced by the memory request, is currently open or closed. Furthermore, the paging logic determines if another page has to be closed to free the bank for accessing the page referenced by the memory request. The present invention supports any memory device requiring a refresh operation. In one embodiment, the circuit 200 transmits the refresh request to a DRAM device. In another embodiment of the invention, the circuit 200 transmits the refresh request to a SDRAM device. In yet another embodiment, the circuit 200 transmits the refresh request to a RDRAM™ device, a Rambus architecture memory chip. The following paragraphs discuss the procedure for creating a refresh request.

The status of the memory banks 111–114 is forwarded to the set of decoders 225 and 226. The decoders 225 and 226 receive n bits of bank status information and generate $2^n$ signal lines, In one embodiment utilizing a four-bank memory system, the decoders receive two bits of bank information and generate four signal lines. Each signal line indicates whether the memory bank 111–114 referenced by the memory request is currently open. The signal lines are logically NOR-ed together by the plurality of logic NOR gates 220. If the output of the NOR gates 220 is a logic high, "1", this represents memory banks with a closed status.

The status array 222 contains the refresh status of the memory banks. In one embodiment, each bit represents the refresh status of a single memory bank. If the value of the bit is set to a 1, the memory bank requires a refresh. The plurality of logic AND gates 224 logically ANDs the output of status array 222 with the outputs of the plurality of the NOR gates 220. Therefore, decoders 225 and 226, the plurality of logic gates 220 and 224, and the status As array 222 represent a "scoreboarding logic", because the output of the AND gates 224 is an array of bits representing banks requiring refresh that are currently not being used by the paging logic, i.e., memory banks with a closed status.

The array of bits is encoded by priority encoder 235 to create a refresh request 236. The refresh packet generator 237 receives the refresh request 236 and generates a refresh packet. The refresh packet generator 237 and the refresh packet will be discussed with reference to FIGS. 3–4.

The command bus 280 transmits the output of the multiplexer 263 on every bus cycle. The multiplexer 263 receives two inputs, the first via input line 239 from the secondary command queue 240 and the second via input line 238 from the refresh packet generator 237. The empty slot detector 261 controls which input is selected by multiplexer 263. The empty slot detector 261 searches for an empty location in the queue 240. In one embodiment, the queue 240 stores Rambus secondary command packets. A Rambus secondary command packet is a command request for a refresh or memory operation for a RDRAM memory device. An empty location in the queue 240 indicates that no command is scheduled for transmitting on the next bus cycle, resulting in a waste of command bandwidth.

The empty slot detector 261 asserts a send refresh signal on line 262 if there is an empty location in the queue 240; causing multiplexer 263 to select the refresh packet from the refresh packet generator 237 on input line 238. Otherwise, the multiplexer 263 selects the next command in the queue 240 via input line 239. The output of the multiplexer is sent to a memory chip via the command bus 280. Therefore, the present invention efficiently utilizes the command bus 280 by issuing a refresh request during an empty location in the queue 240. Otherwise, the command bus 280 is idle due to a lack of a valid command in the empty location in the queue. Furthermore, refresh operations are completed without interfering with performance-critical processor read and write operations.

The bank clearing logic 264 generates an inhibit open signal that prevents memory banks 111–114 from opening any of their pages during the refresh operation. The refresh packet generator 237 waits for a device-dependent amount of time before issuing the refresh packet. The refresh packet is discussed further with reference to FIG. 4. When the bank clearing logic 264 detects that the memory banks have been refreshed, the inhibit open signal is reset to allow opening of the memory banks. Also, after the memory banks have been refreshed, the bank clearing logic asserts a bank clear signal 229 that resets the appropriate bit or bits in the status array 222 associated with the refreshed memory banks.

Those skilled in the art will further appreciate utilizing various embodiments including more memory banks by adding more decoders (225,226), logic gates (220,224), and a larger status array 222. Also, the priority encoder and refresh packet generator may be replaced by a register and a memory controller that issues refresh requests based on the status of the register rather than generating a refresh packet.

FIG. 3 illustrates a refresh packet 328 utilized by an embodiment of the present invention. The refresh packet generator 237 receives the refresh request 236 and generates a refresh packet 328. In one embodiment, the refresh packet 328 is a Rambus secondary command packet. The Rambus secondary command packet comprises a memory operation such as read, write or refresh to a RDRAM device. The refresh packet 328 represents a refresh request to the memory banks that are selected by the outputs of the plurality of AND gates 224. The memory banks for which a refresh is requested are specified by the bit pattern of B0–B3 in columns 310 and 312. The refresh packet 328 is transferred to the bank clearing logic 264 and multiplexer 263 via line 238 as a serial bit stream, starting with the bit in column 302 and ending with the bit in column 318.

Figure 4:
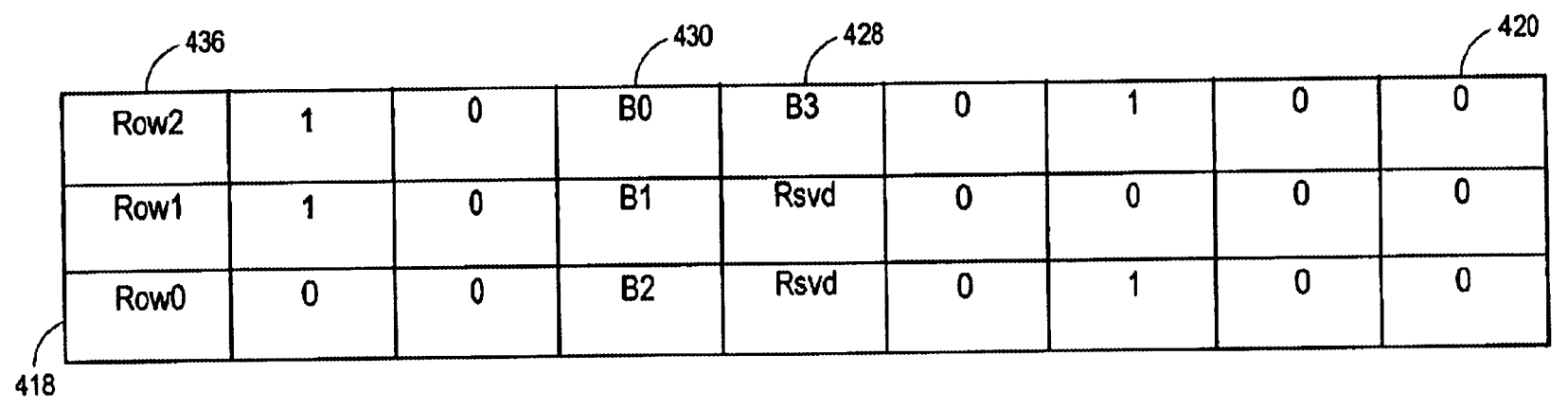

FIG. 4 illustrates a refresh packet 418 utilized by an embodiment of the present invention. The refresh packet generator 237 receives the refresh request 236 and generates a refresh packet 418. The refresh packet 418 represents a refresh termination request of the current refresh request. The memory banks requesting a refresh termination are specified by the bit pattern of B0–B3 in columns 428 and 430. The refresh packet 418 is transferred to the bank clearing logic 264 and multiplexer 263 via line 238, starting from column 420 and ending with column 436.

Figure 5:
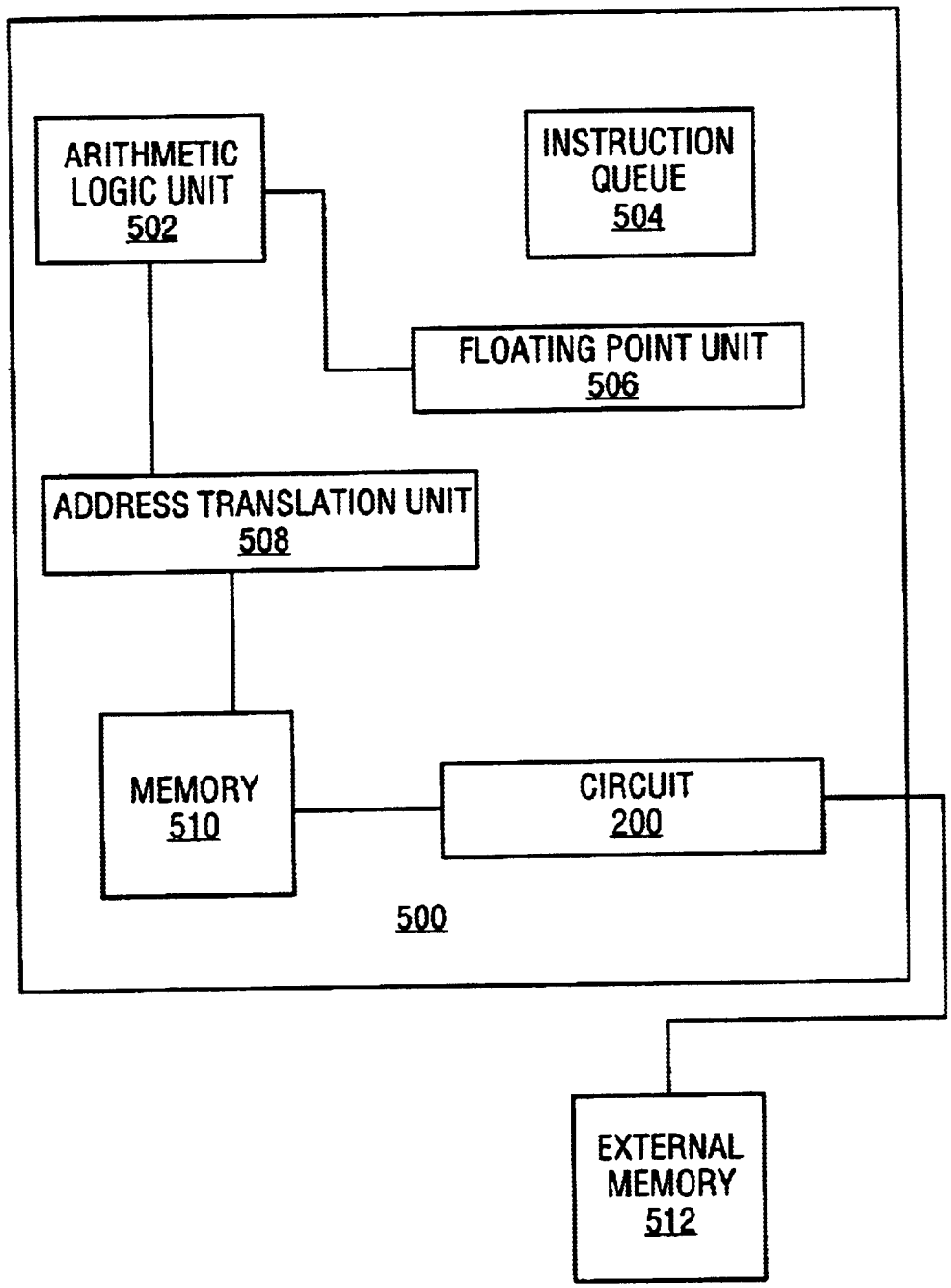
FIG. 5 illustrates a processor utilized by an embodiment of the present invention.

FIG. 5 illustrates a processor 500 utilized by an embodiment of the present invention. The processor 500 comprises: Arithmetic Logic Unit (ALU) 502, instruction queue 504, Floating Point Unit (FPU) 506, address translation unit 508, memory 510, external memory 512, and circuit 200. The processor is coupled to external memory 512 via interconnect 520. The ALU 502 and FPU 506 receive a variety of commands from the instruction queue 504. The commands include various memory requests to memory 510 and external memory 512. In one embodiment, memory 510 is static random access memory and external memory 512 is DRAM or RDRAM. The circuit 200 monitors the memory 510 and external memory 512 and issues refresh requests. The operation of circuit 200 is as described above.

Figure 6:
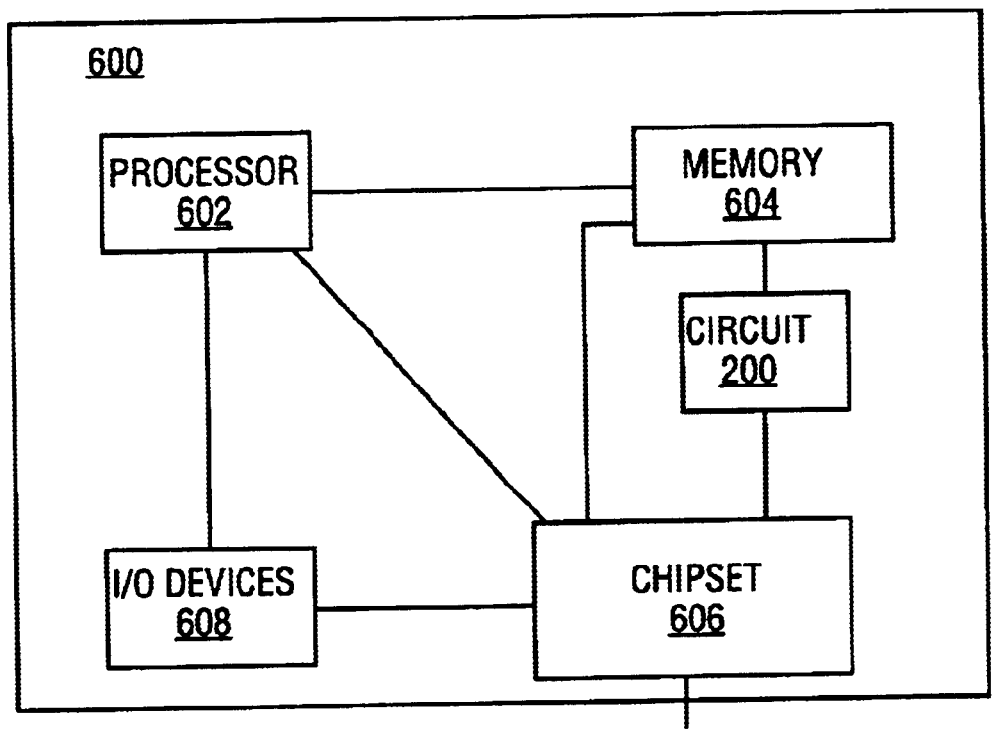
FIG. 6 illustrates a system utilized by an embodiment of the present invention.

FIG. 6 illustrates a system 600 utilized by an embodiment of the present invention. The system comprises processor 602, memory 604, chipset 606, input/output (I/O) devices 608, and circuit 200. An exemplary processor is the Intel Pentium™ III. The processor 602 is coupled to the I/O devices 608, chipset 606, and memory 604. The processor issues memory requests to the memory 604. In one embodiment, the memory 604 is a DRAM device. In another embodiment, the memory 604 is a RDRAM. The chipset 606 receives the refresh requests and initiates the refresh operation on the memory 604. The circuit 200 is coupled to the memory 604 and the chipset 606. The circuit 200 monitors the memory 604 and issues refresh requests for the memory 604 via the chipset 606. The operation of circuit 200 is as described above.

While the invention has been described with reference to specific modes and embodiments, for ease of explanation and understanding, those skilled in the art will appreciate that the invention is not necessarily limited to the particular features shown herein, and that the invention may be practiced in a variety of ways that fall under the scope and spirit of this disclosure. The invention is, therefore, to be afforded the fullest allowable scope of the claims that follow.

What is claimed is:

1. An integrated circuit, comprising:
   a first register to store a first statuses of a plurality of memory banks to indicate which memory banks are closed;
   a second register to store a second statuses of the plurality of memory banks to indicate which memory banks need to be refreshed; and
   a logic circuit coupled to the first register and the second register to generate a third statuses of the plurality of memory banks, wherein the third statuses is not based on a memory access status of another memory bank.

2. The integrated circuit of claim 1 wherein at least one bit of the first statuses of the plurality of memory banks indicates whether a single memory bank of the plurality of memory banks is closed and therefore available for a refresh operation.

3. The integrated circuit of claim 1 wherein at least one bit of the second statuses of the plurality of memory banks indicates whether a single memory bank of the plurality of memory banks needs a refresh operation.

4. The integrated circuit of claim 1 wherein an encoder, coupled to the logic circuit, to generate a refresh packet for a refresh request in response to the third statuses, and the third status is based on the first and second status.

5. The integrated circuit of claim 4 wherein the encoder to generate the refresh request forms a Rambus secondary command packet.

6. The integrated circuit of claim 4 wherein the encoder further comprises a refresh packet generator, the refresh packet generator forms a Rambus secondary command packet.

7. A system comprising:
   a chipset;
   a processor coupled to the chipset;
   a memory device coupled to the chipset and processor, the memory device comprising a plurality of memory cells organized in a plurality of memory banks;
   a circuit coupled to the memory device comprising:
      a first register to store a first status bit for each one of a plurality of memory banks to indicate whether the memory bank is closed;
      a second register to store a second status bit for each one of the plurality of memory banks to indicate whether the memory bank needs to be refreshed; and;
      a logic to generate a refresh packet for a refresh request in response to the first status bit and second status bit of at least one of the plurality of memory banks.

8. The system of claim 7 wherein the circuit further comprises:
   a third register to store a plurality of pending memory commands; and
   a multiplexer coupled to the logic and the third register, to select either one of the refresh request and the plurality of pending memory commands.

9. The system of claim 7 wherein the second status bit for each one of the plurality of memory banks indicates the memory bank needs a refresh request.

10. The system of claim 7 wherein the logic further comprises an encoder circuit coupled to the second register, to form a RAMBUS secondary command packet.

11. The system of claim 7 wherein the memory device is a RDRAM.

12. The system of claim 7 wherein the memory device is a DRAM.

13. The system of claim 8 further comprises a control signal that is generated by a detector coupled to the third register to determine whether there is an empty location in the third register.

14. A processor comprising:
   a logic unit;
      a memory device coupled to the logic unit; the memory device comprising a plurality of memory banks;
      a circuit coupled to the memory device, and comprising:
         a first register to store a first status bit for each one of a plurality of memory banks to indicate whether the memory bank is closed;
         a second register to store a second status bit for each one of the plurality of memory banks to indicate whether the memory bank needs to be refreshed;
         a logic coupled to the first register and second register; and
         a third register coupled to the logic, to generate a refresh packet for a refresh request in response to the first status bit and second status bit of at least one of the plurality of memory banks.

15. The processor of claim 14 wherein the second status indicates its corresponding memory bank of the plurality of memory banks needs a refresh operation.

16. The processor of claim 14 wherein the memory device is a RDRAM.

17. The processor of claim 14 wherein the memory device is a DRAM.

18. The processor of claim 14 wherein the refresh request represents at least one of the plurality of memory banks that need a refresh operation and is closed.

19. The processor of claim 14 wherein the third register further comprises an encoder coupled to the logic, to select either one of the refresh request and a plurality of pending memory commands.

20. A method comprising:
   storing a first status bit for each one of a plurality of memory banks to indicate whether the memory bank is closed;
   storing a second status bit for each one of the plurality of memory banks to indicate whether memory bank needs to be refreshed;
   generating a third status for at least one of the plurality of memory banks; and
   generating a refresh packet for a refresh request in response to the third status.

21. The method of claim 20 wherein the first status bit is generated by a plurality of logic NOR gates.

22. The method of claim 20 wherein the second status bit is stored in an array.

23. The method of claim 20 wherein the plurality of memory banks are RDRAM.

24. The method of claim 20 wherein the plurality of memory banks are DRAM.

25. The method of claim 20 wherein the refresh request represents at least one of the plurality of memory banks that need a refresh operation and is closed.

26. The method of claim 20 wherein the third status is based on the first and second status.

* * * * *

UNITED STATES PATENT AND TRADEMARK OFFICE
CERTIFICATE OF CORRECTION

PATENT NO.    : 6,650,586 B1
DATED         : November 18, 2003
INVENTOR(S)   : Fanning It is certified that error appears in the above-identified patent and that said Letters Patent is hereby corrected as shown below:

Column 3,
Line 22, delete "lines," and insert -- lines. --.
Line 37, delete "As" after the word "status".

Signed and Sealed this

Thirty-first Day of August, 2004

JON W. DUDAS
*Director of the United States Patent and Trademark Office*